(12) United States Patent
Vinnitsky et al.

(10) Patent No.: US 9,805,906 B1
(45) Date of Patent: Oct. 31, 2017

(54) MIRROR SUPPORT MODULE, A KIT AND A SCANNING ELECTRON MICROSCOPE

(71) Applicant: APPLIED MATERIALS ISRAEL LTD., Rehovot (IL)

(72) Inventors: Efim Vinnitsky, Ashkelon (IL); Samuel Ives Nackash, Nes Ziona (IL); Shmuel Barak Mizrahi, Nes Ziona (IL); Natan Schlimoff, Rehovot (IL)

(73) Assignee: APPLIED MATERIALS ISRAEL, LTD., Rehovot (IL)

( * ) Notice: Subject to any disclaimer, the term of this patent is extended or adjusted under 35 U.S.C. 154(b) by 0 days.

(21) Appl. No.: 15/271,100

(22) Filed: Sep. 20, 2016

(51) Int. Cl.
*H01J 37/147* (2006.01)
*H01J 37/20* (2006.01)
*G03F 1/00* (2012.01)
*H01J 37/28* (2006.01)

(52) U.S. Cl.
CPC ............ *H01J 37/147* (2013.01); *H01J 37/28* (2013.01)

(58) Field of Classification Search
CPC .. G03F 7/707; G03F 7/70708; G03F 7/70783; G03F 7/7095; G03F 7/70425; G03F 7/70691; G03F 7/70716; G03F 7/70758; G03F 7/70875; H01J 37/20; H01J 37/3174; H01J 37/16; H01J 37/18; H01J 37/228; H01J 37/244; H01J 37/26
USPC ........... 250/440.11, 442.11, 492.2, 311, 307, 250/441.11, 443.1, 491.1, 492.1; 355/72, 355/53, 75, 73, 76
See application file for complete search history.

(56) References Cited

U.S. PATENT DOCUMENTS

| 5,644,137 | A  | * | 7/1997 | Waggener | ............... | H01J 37/20 250/442.11 |
| 6,252,705 | B1 | * | 6/2001 | Lo | ............ | G12B 5/00 359/383 |
| 6,521,901 | B1 | * | 2/2003 | Shamoun | ............... | B82Y 10/00 250/440.11 |
| 6,653,639 | B1 | * | 11/2003 | Novak | ................... | B82Y 10/00 250/442.11 |
| 6,664,549 | B2 | * | 12/2003 | Kobayashi | ............ | B25B 11/005 250/440.11 |
| 7,119,884 | B2 | * | 10/2006 | Ottens | ................. | G03F 7/70783 355/72 |
| 7,505,118 | B2 | * | 3/2009 | Yang | .................. | G03F 7/70425 355/72 |
| 7,532,310 | B2 | * | 5/2009 | Mertens | .................. | G03F 7/707 355/72 |
| 7,737,419 | B2 | * | 6/2010 | Asano | ................. | G03F 7/70758 250/442.11 |
| 8,603,285 | B1 | * | 12/2013 | Baron | ................... | B82B 3/0047 156/272.2 |
| 8,835,847 | B2 | * | 9/2014 | Yaguchi | ................. | H01J 37/20 250/311 |

(Continued)

*Primary Examiner* — David A Vanore
(74) *Attorney, Agent, or Firm* — Kilpatrick Townsend & Stockton LLP

(57) ABSTRACT

A mirror support module having a body that includes an internal portion surrounding an inner space, an external portion, an aperture formed in the body and an intermediate region that extends between a segment of the internal portion and the aperture. When the intermediate region is subjected to a force directed in a first direction, the intermediate region can be moved in the first direction towards the aperture to reduce an area of the aperture while the external portion remains stable regardless of movement of the intermediate region.

18 Claims, 9 Drawing Sheets

(56) References Cited

U.S. PATENT DOCUMENTS

| | | | | |
|---|---|---|---|---|
| 9,019,476 B2* | 4/2015 | Compen | ................. | G03F 7/707 355/72 |
| 9,508,527 B2* | 11/2016 | Ominami | ................. | H01J 37/16 |
| 2004/0012767 A1* | 1/2004 | Van Elp | ................. | G03F 7/707 355/72 |
| 2005/0230637 A1* | 10/2005 | Fukushima | ............ | B82Y 10/00 250/443.1 |
| 2011/0101222 A1* | 5/2011 | Wang | ..................... | H01J 37/20 250/307 |

* cited by examiner

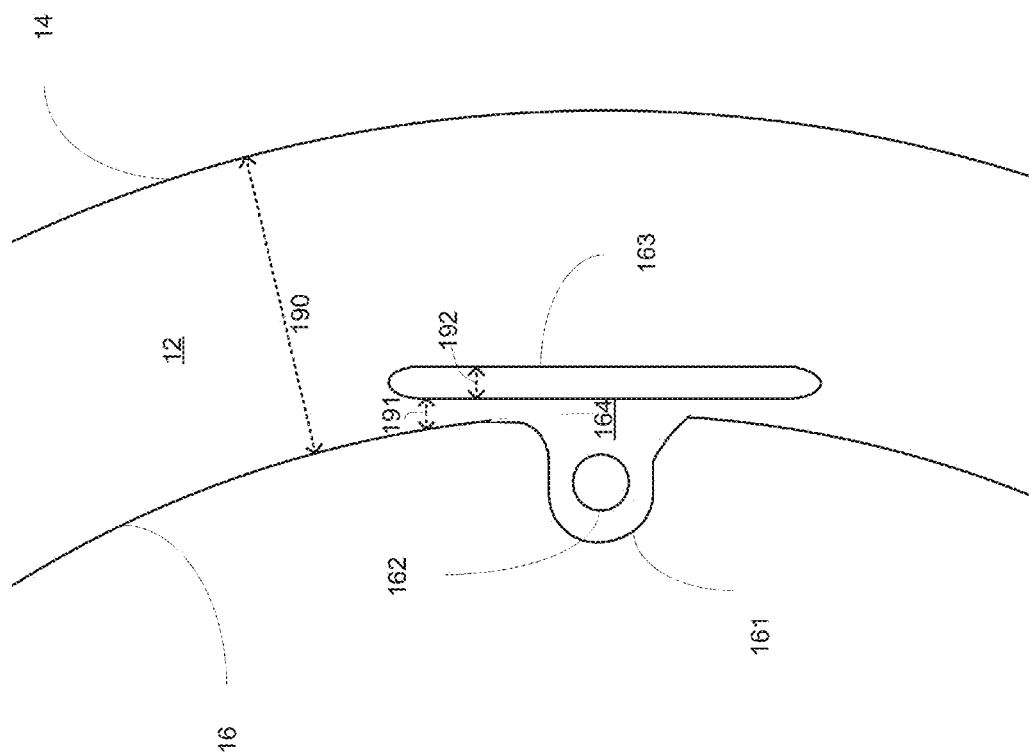

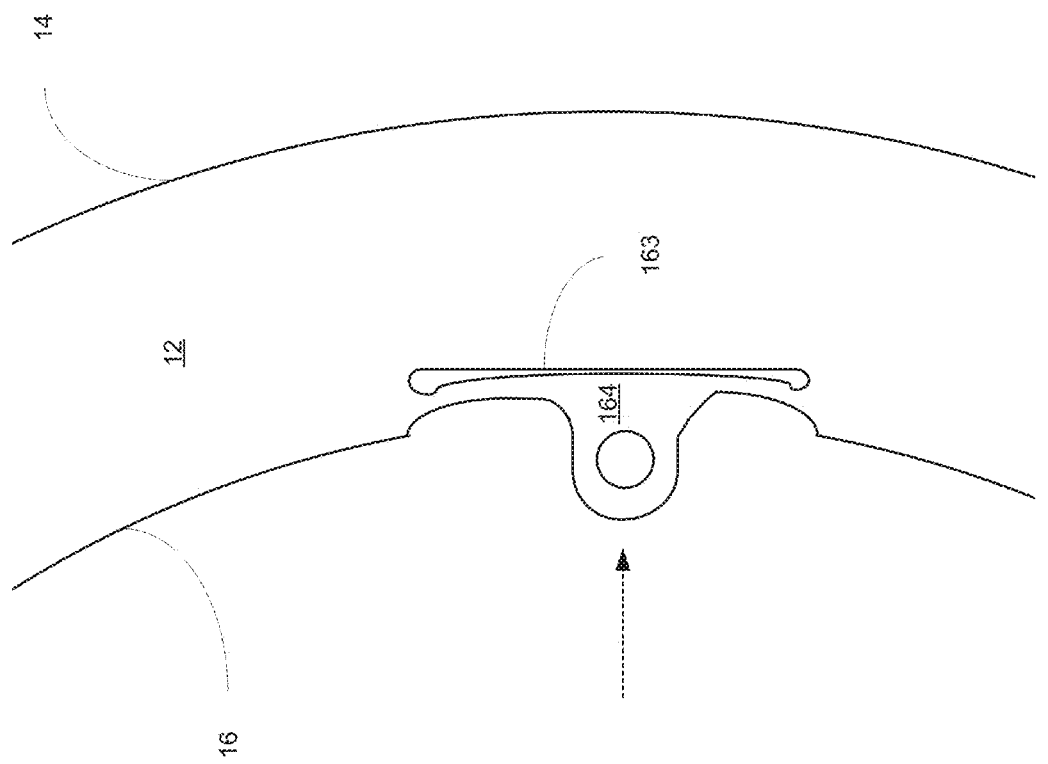

MIRROR SUPPORT MODULE, A KIT AND A SCANNING ELECTRON MICROSCOPE

BACKGROUND OF THE INVENTION

A scanning electron microscope (SEM) includes a SEM column, a chuck for supporting an inspected object, a mechanical stage for moving the chuck and an interferometer. The interferometer includes a controller, a pair of laser heads, a pair of chuck interface mirrors, and a pair of SEM column mirrors.

The pair of SEM column mirrors are connected to the SEM column. The pair of chuck interface mirrors are mechanically coupled to the mechanical stage via mechanical couplers.

The pair of laser heads illuminate the pair of chuck interface mirrors and the pair of SEM column mirrors with laser beams and receive reflected laser beams. The interferometer determines, based on the reflected laser beams, the X-axis distance and the Y-axis distance between the pair of chuck interface mirrors and the pair of SEM column mirrors.

One or more of the SEM column, the mechanical stage, the mechanical couplers and the chuck interface tend to heat during the operation of the SEM. The heating causes the SEM column, the mechanical stage, the mechanical couplers and the chuck interface to expand.

There are differences in the thermal expansion coefficients of the SEM column, the mechanical stage, the mechanical couplers and the chuck interface. The differences between these thermal expansion coefficients introduce an X-axis distance error and a Y-axis distance error.

The X-axis distance error and the Y-axis distance error represent the difference between the displacements, due to the heat, of the pair of chuck interface mirrors and the pair of SEM column mirrors.

The SEM column illuminates the inspected object with a primary beams of electrons. The X-axis distance error and the Y-axis distance error may cause the interferometer to perform false location corrections of the primary beam.

There is a growing need to provide a device for reducing the X-axis distance error and the Y-axis distance error.

SUMMARY OF THE INVENTION

There may be provided a mirror support module for supporting a mirror, the mirror support module may include a body; wherein the body may include an internal portion that surrounds an inner space; an external portion; a first aperture that may be formed in the body; and a first intermediate region that extends between a first segment of the internal portion and the first aperture. The first intermediate region may be configured to move at a first direction and towards the first aperture thereby reducing an area of the first aperture, when the first intermediate region may be subjected to a force that may be directed to the first direction. The external portion maintains stable regardless a movement of the first intermediate region.

The body can be made of an alloy such as Kovar or Invar.

The ratio between a magnitude of the movement of the first intermediate region towards the first aperture and a movement of the external portion at the first direction may exceed 100.

The first segment of the internal portion may protrude towards the inner space.

The mirror support module may include apertures that may be positioned at different angles in relation to a center of the inner space, and intermediate regions that extends between segments of the internal portion and the apertures. The external portion maintains stable regardless a movement of any of the intermediate regions.

The apertures may be arranged in a radially symmetrical manner about the center of the inner space.

The segments of internal portion may protrude towards the inner space.

The mirror support module may include a first interface for attaching the mirror to the mirror support module.

The mirror support module may include a second interface for attaching another mirror to the mirror support module; wherein the mirror and the other mirror may be oriented to each other.

There may be provided a kit that may include a mirror support module, one or more mirrors and one or more interfaces for attaching the mirror to the mirror support module.

There may be provided a scanning electron microscope that may include (a) a scanning electron microscope column that may be configured to generate a primary electron beam; and (b) a mirror support module.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 illustrates a part of a mirror support module according to an embodiment of the invention; and FIG. 9 illustrates a part of a mirror support module according to an embodiment of the invention.

DETAILED DESCRIPTION OF EMBODIMENTS

Figure 1:
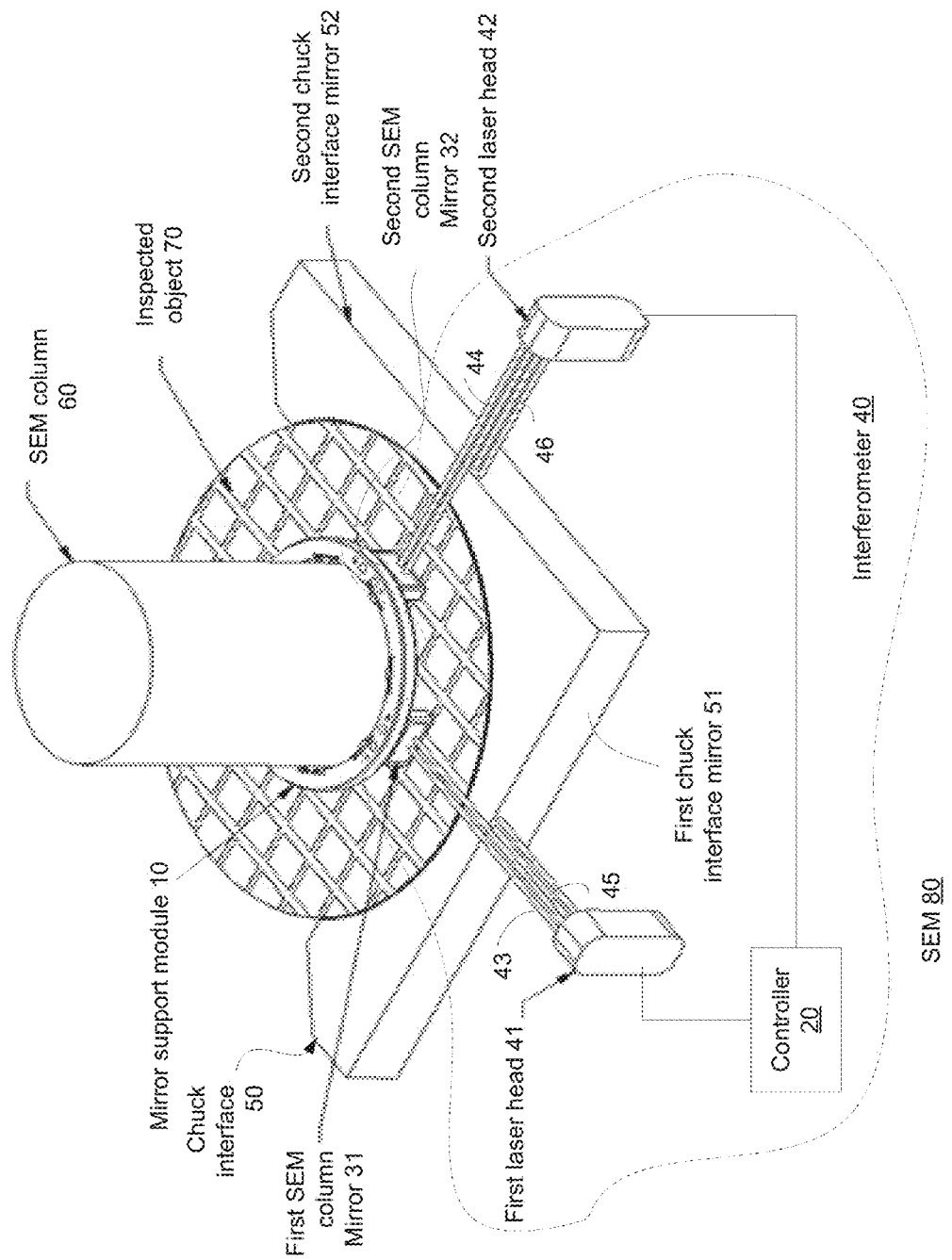
FIG. 1 illustrates a SEM, a SEM column, an inspected object, a chuck interface, a mirror support module and an interferometer according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference to the term "comprising" or "having" should be interpreted also as referring to "consisting" of "essentially consisting of". For example—a system that comprises certain components can include additional components, can be limited to the certain components or may include additional components that do not materially affect the basic and novel characteristics of the system—respectively.

There may be provided a mirror support module that may include a body. The body may include (a) one or more interfacing elements for assisting in attaching one or more mirrors to the mirror support module; (b) an internal portion that surrounds an inner space; an external portion; (c) one or more apertures that are formed in the body, and (d) one or more intermediate regions that extend between one or more segments of the internal portion and the one or more apertures.

The one or more intermediate regions may be small enough (especially have a small enough width) to be flexible despite the rigid material from which the body is made of.

Each one of the one or more intermediate regions may be configured to move at a certain direction towards an aperture thereby reducing an area of an aperture, when the first intermediate region is subjected to a force that is directed to the certain direction.

Different intermediate regions may move at different directions.

The external portion maintains stable (does not perform any substantial movement) regardless movements of the one or more intermediate regions. During the movement of an intermediate region the intermediate region may be bent and/or otherwise deformed.

The mirror support module may be rigid and most of its body will not expand (or barely expand) due to temperature changes. Especially—the external portion of the body will maintain at the same positon—or maintain at substantially the same positon. This lack of movement (or almost lack of movement) guarantees that one or more mirrors (that are attached to the body of the mirror support module) maintain at the same position regardless of the movements of the one or more intermediate regions. The almost lack of movement is small enough such as not to induce X-axis and Y-axis errors above a tolerable threshold.

The mirror support module can be made of various materials such as alloys. Non-limiting examples of alloys include Kovar (nickel-cobalt ferrous allow composition) and Invar (a nickel iron alloy known as 64FeNi). The thermal expansion coefficients of such alloys is within the range of few microns*Kalvin per meter.

It may be beneficial that the mirror support module is made (or at least includes) conductive materials—in order to reduce the chance that the mirror support module will be charged and then may breakdown.

The one or more mirrors should be attached to parts of the body that differ from the one or more intermediate regions.

A SEM column may be positioned within the inner space defined by the mirror support module so that the SEM column is surrounded by the mirror support module.

When the SEM column heats and expands—one or more intermediate regions of the mirror support module may be may be pressed outwards and may compress or otherwise reduce the size of one or more apertures of the mirror support module.

The expansion of the SEM column does not change (or only slightly changes) the location of the mirror attached to the body—thus dramatically reducing the X-axis distance error and the Y-axis distance error.

FIG. 1 illustrates an example of a SEM 80 that includes SEM column 60, inspected object 70, chuck interface 50, mirror support module 10 and interferometer 40.

The interferometer 40 includes first laser head 41, second laser head 42 and controller 20.

The interferometer 40 may be regarded as including the first SEM column mirror 31, the second SEM column mirror 32, first chuck interface mirror 51 and the second chuck interface mirror 52.

The first chuck interface mirror 51 and the second chuck interface mirror 52 may be an integral part of the chuck interface 50 or may be glued or otherwise attached to the chuck interface 50.

Mirror support module 10 is mechanically coupled to the SEM column 60 and surrounds the SEM column 60. The mirror support module 10 also holds first SEM column mirror 31 and second SEM column mirror 32.

When the SEM column 60 expands (due to a heating of the SEM column 60), the SEM column may move the interior portion of the mirror support module 10 but this movement does not affect (or does not substantially affect) the location of first SEM column mirror 31 and does not affect (or does not substantially affect) the location of the second SEM column mirror 32.

The first laser head 41 (of an interferometer) illuminates the first SEM column mirror 31 with first upper laser beam 43 and illuminates a first chuck interface mirror 51 with a first lower laser beam 45.

The second laser head 42 (of an interferometer) illuminates the second SEM column mirror 32 with second upper laser beam 44 and illuminates a second chuck interface mirror 52 with a second lower laser beam 46.

The first laser head 41 receives reflected laser beams from the second SEM column mirror 32 and from the second chuck interface mirror 52—and is configured to determine the X-axis distance between the chuck interface 50 the SEM column 60.

The location of the first SEM column mirror 31 and the location of the first chuck interface mirror 51 remain substantially unchanged despite the expansion of the SEM column 60. Therefore—the X-axis distance error is dramatically reduced and even may be zeroed.

The location of the second SEM column mirror 32 and the location of the second chuck interface mirror 52 remain substantially unchanged despite the expansion of the SEM column 60. Therefore—the Y-axis distance error is dramatically reduced and even may be zeroed.

The first laser head 41 and/or controller 20 may be configured to determine the X-axis distance between the first laser head 41 and the first chuck interface mirror 51 as well as the X-axis distance between the first laser head 41 and the first SEM column mirror 31. Based on the X-axis distances the first laser head 41 and/or controller 20 may determine the X-axis distance between the chuck interface 50 and the SEM column (while ignoring the expansion of the SEM column).

The second laser head 42 and/or controller 20 may be configured to determine the Y-axis distance between the second laser head 42 and the second chuck interface mirror 52 as well as the Y-axis distance between the second laser head 42 and the second SEM column mirror 32. Based on the Y-axis distances the second laser head 42 and/or controller 20 may determine the Y-axis distance between the chuck interface 50 and the SEM column (while ignoring the expansion of the SEM column).

Figure 2:
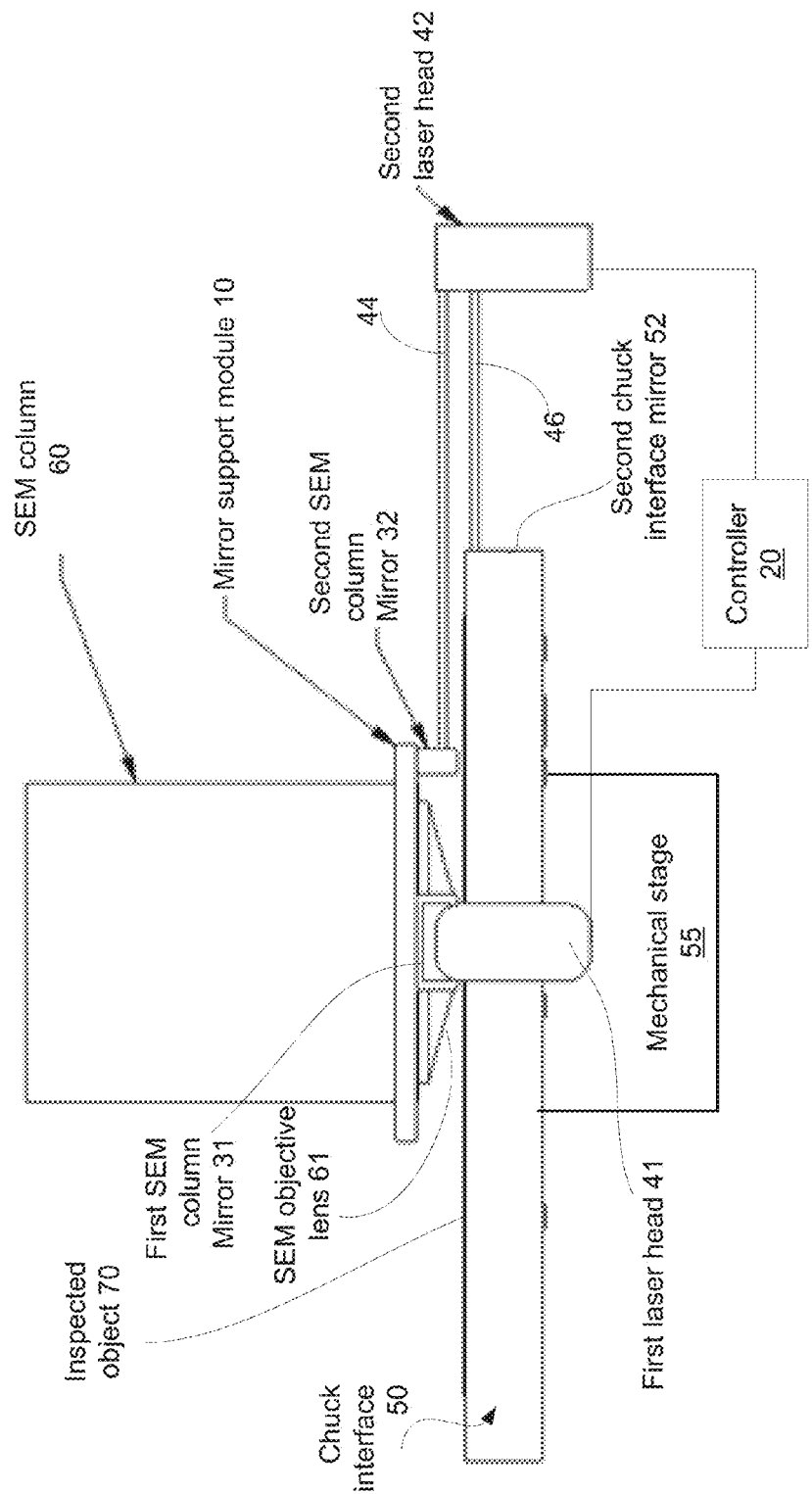
FIG. 2 illustrates a SEM column, an inspected object, a chuck interface, a mirror support module, an interferometer and a mechanical stage according to an embodiment of the invention.

FIG. 2 is a side view of an example of SEM column 60, inspected object 70, chuck interface 50, mirror support module 10, an interferometer and mechanical stage 55.

FIG. 2 illustrates SEM objective lens 61 that is the lowest part of SEM column 60.

Figure 3:
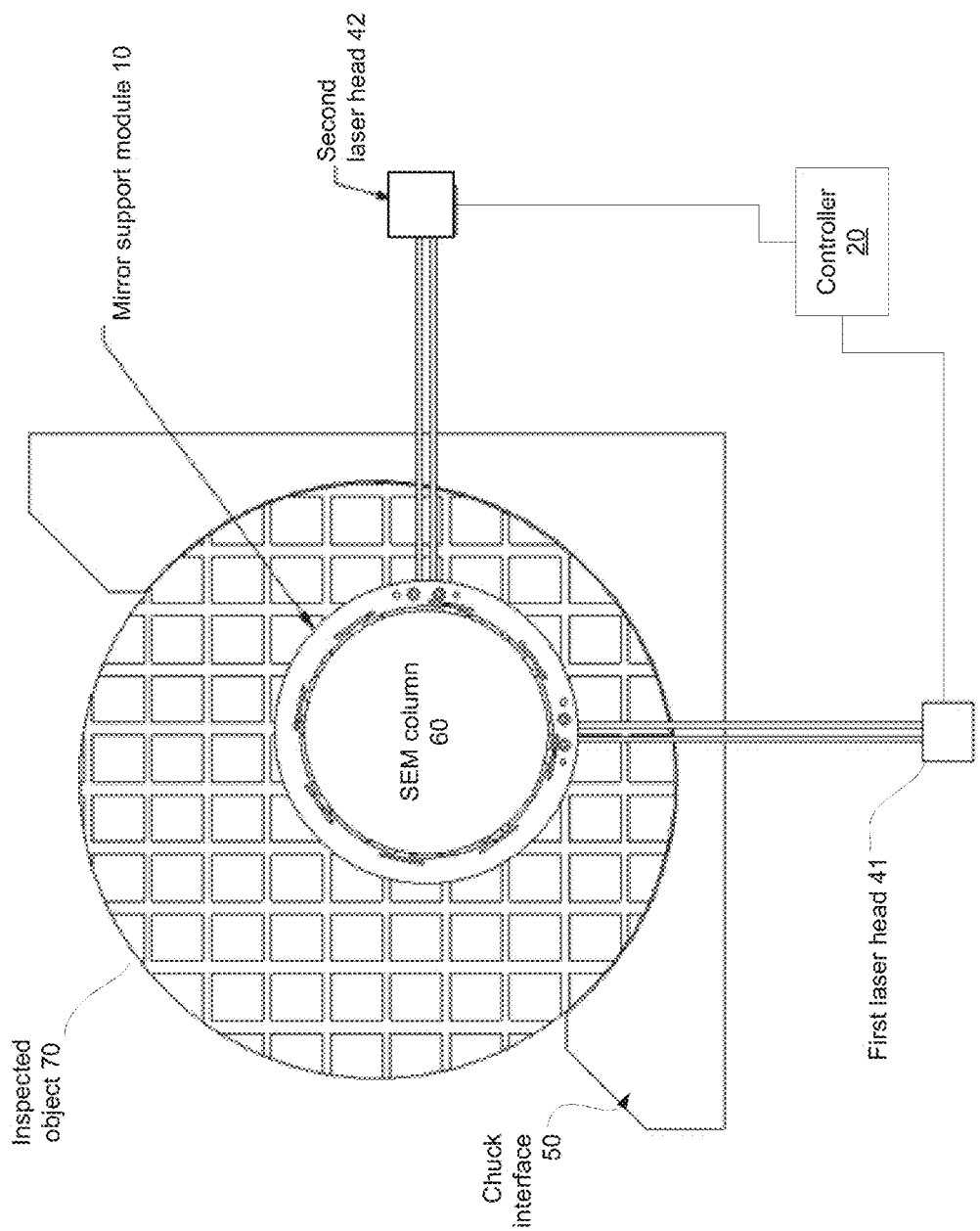
FIG. 3 illustrates a SEM column, an inspected object, a chuck interface, a mirror support module and an interferometer according to an embodiment of the invention.

FIG. 3 is a top view of an example of SEM column 60, inspected object 70, chuck interface 50, mirror support module 10 and an interferometer.

Figure 4:
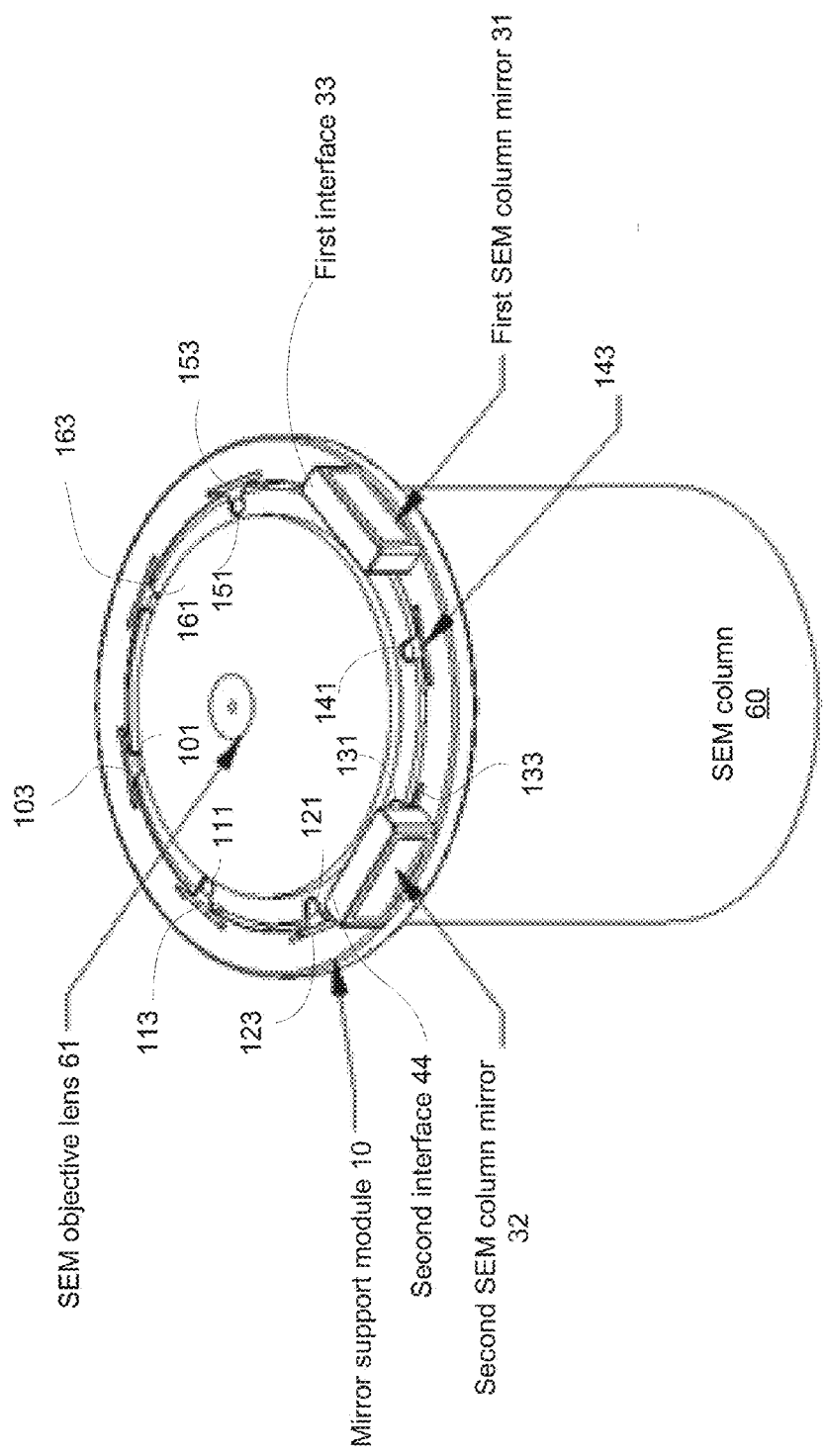
FIG. 4 illustrates a SEM column, a SEM objective lens, a mirror support module and a pair of interferometer mirrors according to an embodiment of the invention.

FIG. 4 illustrates an example of a SEM column 60 that is inverted, SEM objective lens 61, mirror support module 10, first SEM column mirror 31 and second SEM column mirror 32.

The mirror support module 10 also includes first aperture 103, second aperture 113, third aperture 123, fourth aperture 133, fifth aperture 143, sixth aperture 153, seventh aperture 163, eighth aperture 173, first segment 101, second segment 111, third segment 121, fourth segment 131, fifth segment 141, sixth segment 151, seventh segment 161 and eighth segment 171 of the internal portion.

The first SEM column mirror 31 is mechanically coupled to body 12 via first interface 33. The first interface 33 may be glued or otherwise attached (for example by screws) to body 12 and may contact first SEM column mirror 31 by springs or any other attachment elements.

The second SEM column mirror 32 is mechanically coupled to body 12 via second interface 34. The second interface 34 may be glued or otherwise attached (for example by screws) to body 12 and may contact second SEM column mirror 32 by springs or any other attachment elements.

The first and second interfaces can be made of the same material as the body, can be an integral part of the mirror support module or can be made of a separate material than the body. The first and second interfaces can be electrically insulating or electrically conductive.

Figure 5:
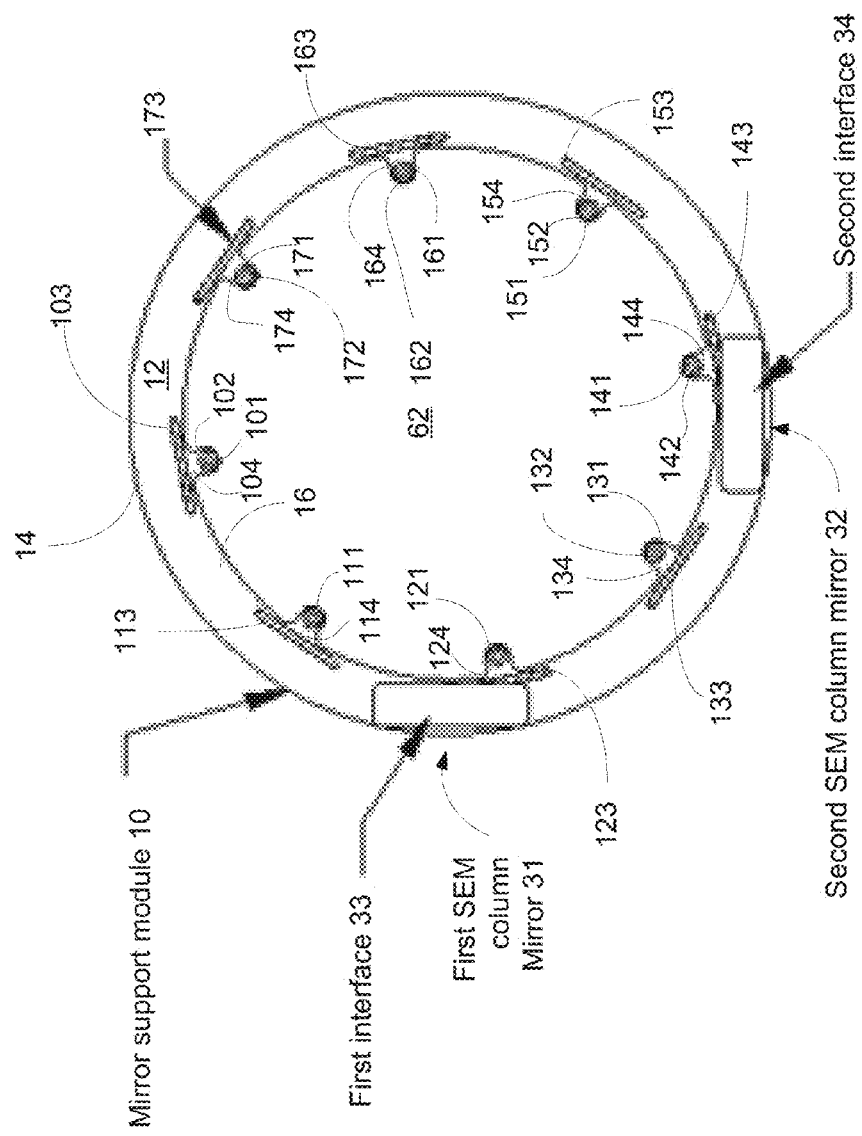
FIG. 5 illustrates a mirror support module and a pair of interferometer mirrors according to an embodiment of the invention.

FIG. 5 illustrates an example of mirror support module 10, first SEM column mirror 31 and second SEM column mirror 32.

Mirror support module 10 include a body 12 that has an external portion 14 and an internal portion 16.

Body 12 includes first aperture 103, second aperture 113, third aperture 123, fourth aperture 133, fifth aperture 143, sixth aperture 153, seventh aperture 163, eighth aperture 173, first segment 101, second segment 111, third segment 121, fourth segment 131, fifth segment 141, sixth segment 151, seventh segment 161 and eighth segment 171 of the internal portion. The first till eighth segments of the internal portion extend (protrude) towards the center 63 of an inner space 62.

First intermediate region 104 extends between the first segment 101 of the internal portion and the first aperture 103.

Second intermediate region 114 extends between the second segment 111 of the internal portion and the second aperture 113.

Third intermediate region 124 extends between the third segment 121 of the internal portion and the third aperture 123.

Fourth intermediate region 134 extends between the fourth segment 131 of the internal portion and the fourth aperture 133.

Fifth intermediate region 144 extends between the fifth segment 141 of the internal portion and the fifth aperture 143.

Sixth intermediate region 154 extends between the sixth segment 151 of the internal portion and the sixth aperture 153.

Seventh intermediate region 164 extends between the seventh segment 161 of the internal portion and the seventh aperture 163.

Eighth intermediate region 174 extends between the eighth segment 171 of the internal portion and the eighth aperture 173.

Body 12, and especially first till eights segments, includes first interfacing element 102, second interfacing element 112, third interfacing element 122, fourth interfacing element 132, fifth interfacing element 142, sixth interfacing element 152, seventh interfacing element 162 and eighth interfacing element 172 that alone or with combination with one or more additional interfacing elements attach the mirror support module 10 to the SEM column (not shown in FIG. 5).

The interfacing elements may be threaded holes and the additional interfacing elements may be blots.

FIG. 5 illustrates that the first SEM column mirror 31 is mechanically coupled to body 12 via first interface 33 and that the second SEM column mirror 32 is mechanically coupled to body 12 via second interface 34.

Figure 6:
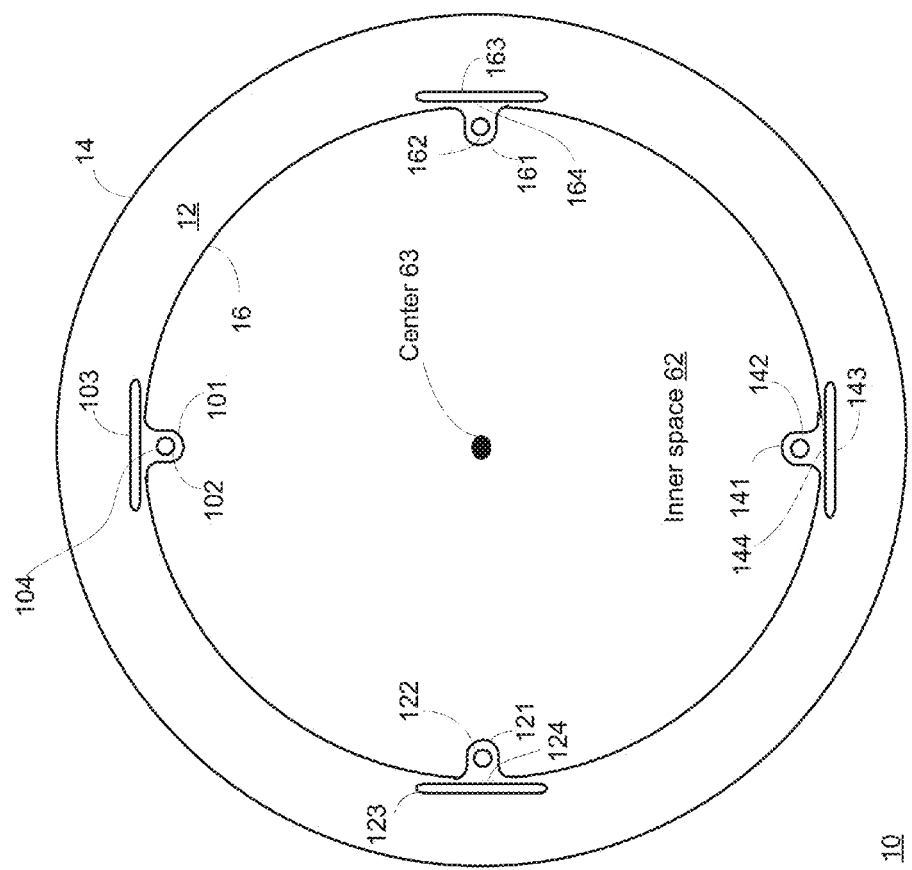
FIG. 6 illustrates a mirror support module according to an embodiment of the invention.
Figure 7:
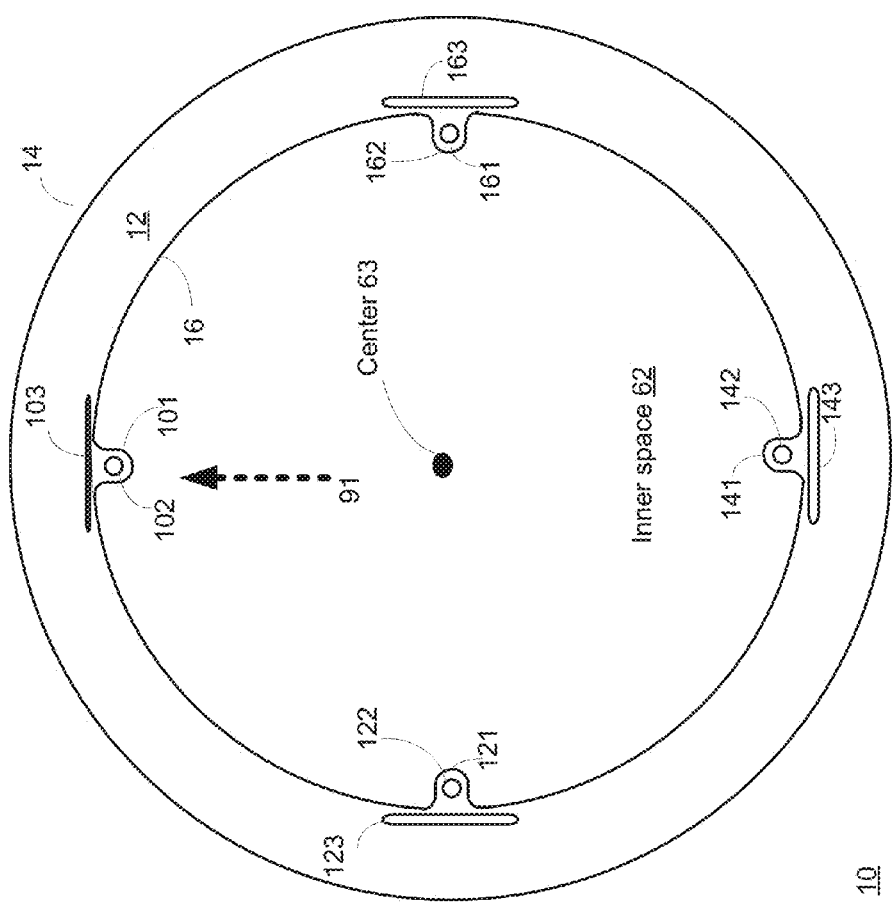
FIG. 7 illustrates a mirror support module according to an embodiment of the invention.

FIGS. 6 and 7 illustrate an example of mirror support module 10.

For simplicity of explanation the mirror support module 10 is illustrated as including (a) first, third, fifth and seventh intermediate regions, (b) first, third, fifth and seventh apertures, (c) first, third, fifth and seventh interfacing elements, and (d) first, third, fifth and seventh segments.

FIG. 6 illustrates mirror support module 10 when the SEM column (not shown) does not expand.

FIG. 7 illustrates mirror support module 10 when the SEM column (not shown) expands at a first direction 91 towards the first segment 101. This movement forces the first segment 101 to move towards the first aperture 103 and to virtually close the first aperture 103. The external portion 14 remains stable—it does not move.

FIG. 7 also illustrates the distance 191 between the seventh aperture 163 and the internal portion 16, the width 193 of the seventh aperture 192 and the width 190 of body. Width 190 of body 12 well exceeds distance 191 and width 190.

FIGS. 8 and 9 illustrate an example of a part of mirror support module 10 that includes seventh intermediate region 164, seventh aperture 163, seventh interfacing element 162, and seventh segment 161.

FIG. 8 illustrates the part of the mirror support module 10 when the SEM column (not shown) does not expand.

FIG. 9 illustrates the part of the mirror support module 10 when the SEM column (not shown) expands towards the seventh segment 161. This movement forces the seventh segment 161 to move towards the seventh aperture 163 and to virtually close the seventh aperture 163. The external portion 14 remains stable—it does not move.

The number of apertures, intermediate regions, segments of internal regions may be one, two, may exceed two or may be any number. The number of apertures may differ from at least one of the number of intermediate regions and the number of segments of the internal region.

The shape and size of the body, apertures, intermediate regions, segments of internal regions may differ from those illustrated in FIGS. 1-9. For example—the external portion may have a ring shape or any other shape (such as a polygon).

Although the first and second SEM column mirrors are illustrated as being connected below the body of the Mirror support module—the first and second SEM column mirrors may be connected in any manner to the body of the Mirror support module.

The mirror support module may be sold or distributed with the

In FIGS. 1-9 the following reference numbers refer to:

| Reference Number | Description |
| --- | --- |
| 10 | Mirror support module |
| 12 | Body (of Mirror support module) |
| 14 | Exterior portion (of Mirror support module) |
| 16 | Interior portion (of Mirror support module) |
| 20 | Controller |
| 31 | First SEM column mirror |
| 32 | Second SEM column mirror |
| 33 | First interface |
| 34 | Second interface |
| 40 | Interferometer |
| 41 | First laser head |
| 42 | Second laser head |
| 43 | First upper laser beam |
| 45 | First lower laser beam |
| 44 | Second upper laser beam |
| 46 | Second lower laser beam |
| 50 | Chuck interface |
| 51 | First chuck interface mirror |
| 52 | Second chuck interface mirror |
| 55 | Mechanical stage |
| 60 | SEM column |
| 61 | SEM objective lens |
| 62 | Inner space |
| 63 | Center of inner space |
| 70 | Inspected object |
| 80 | SEM |
| 101, 111, 121, 131, 141, 151, 161, 171 | First till eighth segments of the internal portion |
| 102, 112, 122, 132, 142, 152, 162, 172 | First till eighth interfacing elements |
| 103, 113, 123, 133, 143, 153, 163, 173 | First till eighth apertures |
| 104, 114, 124, 134, 144, 154, 164, 174 | First till eighth intermediate regions |
| 190 | Width of body |
| 191 | Distance between first aperture and interior portion |
| 192 | Width of first aperture |

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A mirror support module for supporting a mirror, the mirror support module comprising:
a body that comprises an internal portion that surrounds an inner space, an external portion, a first aperture formed in the body, and a first intermediate region that extends between a first segment of the internal portion and the first aperture;

wherein the first intermediate region is configured to move at a first direction and towards the first aperture thereby reducing an area of the first aperture, when the first intermediate region is subjected to a force that is directed to the first direction; and wherein the external portion maintains stable regardless a movement of the first intermediate region.

2. The mirror support module according to claim 1 wherein the body comprises a nickel-cobalt ferrous alloy.

3. The mirror module according to claim 1 wherein a ratio between a magnitude of the movement of the first intermediate region towards the first aperture and a movement of the external portion at the first direction exceeds 100.

4. The mirror support module according to claim 1 wherein the first segment of the internal portion protrudes towards the inner space.

5. The mirror support module according to claim 1 further comprising:

apertures that are positioned at different angles in relation to a center of the inner space; and intermediate regions that extends between segments of the internal portion and the apertures; and wherein the external portion maintains stable regardless a movement of any of the intermediate regions.

6. The mirror support module according to claim 5 wherein the apertures are arranged in a radially symmetrical manner about the center of the inner space.

7. The mirror support module according to claim 5 the segments of internal portion protrude towards the inner space.

8. The mirror support module according to claim 1 wherein the body comprises a nickel iron alloy.

9. The mirror support module according to claim 1 further comprising a first interface for attaching the mirror to the mirror support module.

10. The mirror support module according to claim 9 further comprising a second interface for attaching another mirror to the mirror support module; wherein the mirror and the other mirror are oriented to each other.

11. A kit comprising:

a mirror;

a mirror support module having a body that comprises: an internal portion that surrounds an inner space, an external portion, a first aperture that is formed in the body, and a first intermediate region that extends between a first segment of the internal portion and the first aperture; and an interface for attaching the mirror to the mirror support module;

wherein the first intermediate region is configured to move at a first direction and towards the first aperture thereby reducing an area of the first aperture, when the first intermediate region is subjected to a force that is directed to the first direction; and wherein the external portion maintains stable regardless a movement of the first intermediate region.

12. The kit according to claim 11 wherein the base comprises a nickel-cobalt ferrous alloy.

13. The kit according to claim 11 wherein a ratio between a magnitude of the movement of the first intermediate region towards the first aperture and a movement of the external portion at the first direction exceeds 100.

14. The kit according to claim 11 wherein the first segment of the internal portion protrudes towards the inner space.

15. A scanning electron microscope, comprising:

a scanning electron microscope column that is configured to generate a primary electron beam;

a mirror support module including a body that comprises: an internal portion that surrounds an inner space in which the scanning electron microscope column is positioned, an external portion, a first aperture that is formed in the body, and a first intermediate region that extends between a first segment of the internal portion and the first aperture; and an interface for attaching a mirror to the mirror support module;

wherein the first intermediate region is configured to move at a first direction and towards the first aperture thereby reducing an area of the first aperture, when the first intermediate region is subjected to a force that is directed to the first direction due to a heating of the scanning electron microscope column; and wherein the external portion maintains stable regardless a movement of the first intermediate region.

16. The scanning electron microscope according to claim 15 wherein the base comprises a nickel-cobalt ferrous alloy.

17. The scanning electron microscope according to claim 15 wherein a ratio between a magnitude of the movement of the first intermediate region towards the first aperture and a movement of the external portion at the first direction exceeds 100.

18. The scanning electron microscope according to claim 15 wherein the first segment of the internal portion protrudes towards the inner space.

* * * * *